United States Patent
Lymer

(10) Patent No.: US 6,853,176 B2
(45) Date of Patent: Feb. 8, 2005

(54) POWER MEASUREMENT APPARATUS AND METHOD THEREFOR

(75) Inventor: Anthony Lymer, West Lothian (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/766,083

(22) Filed: Jan. 27, 2004

(65) Prior Publication Data

US 2004/0183519 A1 Sep. 23, 2004

(30) Foreign Application Priority Data

Mar. 18, 2003 (EP) .............................................. 03251632

(51) Int. Cl.[7] .............................................. G01R 19/00
(52) U.S. Cl. .................................. 324/76.11; 324/158.1
(58) Field of Search .......................... 324/158.1, 76.11, 324/76.17, 76.75, 76.78, 76.79, 763, 765

(56) References Cited

U.S. PATENT DOCUMENTS

| | | | |
|---|---|---|---|
| 3,626,290 A | | 12/1971 | Aslan |
| 4,031,365 A | * | 6/1977 | Raggiotti et al. ............ 702/131 |
| 4,396,020 A | * | 8/1983 | Wolff et al. .................. 600/551 |

FOREIGN PATENT DOCUMENTS

GB          605734          7/1948

* cited by examiner

*Primary Examiner*—Evan Pert
*Assistant Examiner*—Trung Q Nguyen

(57) ABSTRACT

A self-balancing impedance bridge circuit apparatus includes a sensor device and an electrical element providing a selectable impedance value such that the impedance of the sensor device corresponds to the temperature of the sensor device remaining within acceptable limits.

19 Claims, 2 Drawing Sheets

US 6,853,176 B2

POWER MEASUREMENT APPARATUS AND METHOD THEREFOR

TECHNICAL FIELD

The present invention relates to an apparatus for measuring RF power of the type, for example, comprising a self-balancing impedance bridge, one branch of which comprises a sensor element, the impedance of which can be altered. The present invention also relates to a method of measuring RF power for the above apparatus.

BACKGROUND ART

An output power level of a system is frequently a critical factor in the design and performance of almost all radio frequency and microwave equipment incorporating the system. For the measurement of certain power levels, power meters employing thermocouple sensors are considered preferable to power meters employing thermistor sensors since, in addition to possessing an inherent square-law detection characteristic, the thermocouple sensors exhibit a higher sensitivity and has a higher dynamic range of powers measured than the thermistor sensors.

However, one criticism of power measurements taken using thermocouple power meters is that the power meters that use thermocouples do not exercise direct power substitution. Consequently, a given measurement circuit can produce different DC output voltages as a result of sensitivity differences between different sensors being used with the given measurement circuit. Alternatively, or additionally, the different output voltages can be attributed to drift in the sensitivity of a given sensor unit due to aging of the thermocouple sensor of the given sensor unit or temperature effects. Since power meter systems using thermocouple sensors do not possess a feedback path to enable correction for differences in sensor sensitivities, aging of the thermocouple sensors, or temperature effects, power measurements taken with thermocouple sensors are said to be uncorrected and are, hence, considered less accurate than power measurements taken using thermistor power meters. In contrast, power meters using thermistor sensors employ a so-called DC-substitution process.

In order to overcome the above shortcomings of power meters that use thermocouple sensors, it is known to equip the power meters with a power reference oscillator, typically operating at a frequency of 50 MHz and an output power of 1 mW. If a user of the power meter needs to verify the accuracy of the power meter, thermocouple sensor and cable coupled in-between (hereinafter referred to as the "power measurement system"), or adjust the power meter for a sensor of a different sensitivity, the user can connect the thermocouple sensor to an output of the power reference oscillator of the power meter and, using a calibration adjustment, set the power meter to read a known value of a reference power generated by the power reference oscillator, for example 1.00 mW, or a value derived from the known value of the reference power. The overall accuracy of the power measurement system is dependent upon the accuracy of the power reference oscillator.

The reference oscillator is therefore clearly an important part of power measurement systems, especially those using thermocouple or diode sensors, if accuracy of power measurements is to be maintained. One important parameter of the reference oscillator which needs to be maintained is an output impedance of the reference oscillator in order to ensure that the impedances of the meter/cable/sensor combination and the reference oscillator are matched so that a correct amount of RF power is transferred from the reference oscillator to the power measurement system.

In the context of testing the output impedance of the reference oscillator, it therefore follows that the transfer of RF power from a source (the reference oscillator) to a test load (a test power meter/cable/sensor combination) is dependent upon the impedance of the load and the effective impedance of the source. The RF power, $P_A$, transferred can be expressed in terms of Voltage Reflection Coefficients (VRCs):

$$P_A = P_{Z_0} \times \frac{1 - |\Gamma_2|^2}{|1 - \Gamma_S \Gamma_L|^2} \qquad (1)$$

where:

$P_{Z_0}$ is the power that the source can deliver to a load equal to $Z_0 \Omega$; and $\Gamma_S$ and $\Gamma_L$ are the respective, complex number, VRCs of the source and the load.

However, in most cases, only magnitudes of the source VRC and the load VRC are known, and so only upper and lower limits can be placed on the transferred power level, $P_A$. Consequently, an uncertainty as to the exact amount of power transferred from the reference oscillator to the test power meter exists. Mathematically, the uncertainty, U, can be expressed approximately as follows:

$$U = \pm 200 |\Gamma_S \Gamma_L| \% \qquad (2)$$

As an example, for a known reference oscillator of an Agilent Technologies, Inc. E4418B power meter generating an output signal having a frequency of 50 MHz at a power level of 1 mW, an overall uncertainty attributable to a measurement of the power level of the output signal is of the order of ±0.5% to 0.7%. Approximately, 0.1% to 0.3% of the overall uncertainty can be attributed to the mismatch uncertainty associated with the transfer of the power of the reference oscillator output signal to the test power meter. The mismatch uncertainty can therefore make a significant contribution to the overall uncertainty attributable to the measurement of the power level of the output signal mentioned above. Given the purpose served by reference oscillators, and more generally power reference sources, the mismatch uncertainty therefore needs to be maintained at a very low value. There is therefore clearly a need to calculate the mismatch uncertainty associated with the amount of power transferred from the reference oscillator to the test power meter, and so values for the load and source VRCs, $\Gamma_L, \Gamma_S$, need to be measured or calculated.

Whilst the VRC of the load (the test meter system) can be measured with relative ease using conventional methods, the VRC of the source (the reference oscillator) can only be established when the reference oscillator is active. As a result of the need for the reference source to be active, known measurement techniques, such as Vector Network Analysis (VNA), can not be used, because VNA relies upon a principle of applying a sinusoidal signal to the reference oscillator and measuring relative amplitude and phase of a reflected signal; the reflected signal will be distorted by the signal generated by the reference oscillator. It will therefore be impossible to measure accurately the proportion of the VNA signal that has been reflected, as the VNA signal and the signal generated by the reference oscillator are at a same frequency.

Another known technique is a so-called impedance bridge for measuring the output impedance of the reference oscillator. However, the signal generated by the reference oscillator will also interact with the impedance bridge in such a way as to render any measurement of the impedance of the reference oscillator inaccurate.

In order to obviate the above disadvantage of the impedance bridge measurement technique, another known measurement technique disclosed in the Agilent E4416A/E4417A Service Guide (Agilent Technologies Limited, E4416-90014) provides a way of measuring the source match using a modified impedance bridge. In particular, the technique employs an Agilent Technologies Inc 432A power meter having a self-adjusting impedance bridge, one branch of the impedance bridge comprising thermistors, the impedance of which can be altered by altering a switchable resistance, in an adjacent branch, between two settings: 200Ω and 100Ω. The switching of the resistance results in a consequential change in the impedance of the thermistors, and hence the VRC of the test meter system, or load. Consequently, a mechanism is provided to switch the load VRC, $\Gamma_L$, between two values, allowing the source VRC, $\Gamma_S$, to be calculated approximately, and verified by measurement using conventional means. Once the source VRC, $\Gamma_S$, is known, it is possible, using equation (2), to calculate the mismatch uncertainty, U, associated with the transfer of power from the reference oscillator to the 432A test power meter and with the adjustment of the output power of the reference oscillator.

However, some thermistors employed in sensor units have a negative temperature coefficient with respect to resistance. As a result, the temperature of the thermistor(s) rise(s) when the resistance of the thermistor(s) fall(s). This temperature rise can make the sensor unit less reliable, or can even damage the thermistor(s) and hence the sensor unit.

DISCLOSURE OF INVENTION

According to a first aspect of the present invention, there is provided a self-balancing impedance bridge circuit apparatus for measuring RF power, the apparatus comprising: a bridge circuit comprising a first branch connected to a second branch thereof; wherein the first branch comprises a sensor device having an impedance value and a temperature coefficient associated therewith, a temperature of the sensor device being related to the impedance value; the second branch comprises at least one electrical element capable of providing a selectable impedance value, the selectable impedance value biasing, when in use, the impedance value of the sensor device; and the selectable impedance value is such that the impedance value of the sensor device corresponds to the temperature of the sensor device not exceeding a predetermined temperature.

The temperature coefficient may be a negative temperature coefficient.

The sensor device may be a bolometric device, and in one possible embodiment the bolometric device may be a thermistor.

The at least one electrical element capable of providing the selectable impedance value may be switchable and/or the at least one electrical element capable of providing the selectable impedance value may be a network of impedances.

The network of impedances may comprise a first impedance, a second impedance, and a switch for connecting the first impedance or the second impedance in-circuit with respect to the bridge circuit.

The apparatus may further comprise another sensor device coupled to the sensor device. The sensor device may behave as series coupled to the another sensor device with respect to the bridge circuit, and the sensor device may behave as parallel coupled to the another sensor device, when an RF signal is applied at a node between the sensor device and the another sensor device.

The bridge circuit may further comprise: a third branch that may be coupled to a fourth branch, the third and fourth branches including a substantially same impedance; and the third branch may be coupled to the second branch and the fourth branch may be coupled to the first branch.

According to a second aspect of the present invention, there is provided a power meter and sensor unit comprising the apparatus as set forth above in accordance with the first aspect of the present invention.

According to a third aspect of the present invention, there is provided a method of measuring RF power for a self-adjusting impedance bridge, the method comprising the steps of: setting a selectable impedance value of a first branch of a bridge circuit so as to bias an impedance of a sensor device in a second branch of the bridge circuit coupled to the first branch of the bridge circuit, a temperature of the sensor device relating to the impedance of the sensor device; wherein the sensor device has a temperature coefficient associated therewith; and the selectable impedance value is such that the impedance of the sensor device corresponds to the temperature of the sensor device not exceeding a predetermined temperature.

The method may further comprise the step of: making a first measurement of the power of an RF signal. A second measurement of the power of the RF signal may be made after changing the selectable impedance value.

The temperature coefficient may be a negative temperature coefficient.

The sensor device may be a bolometric device, the bolometric device may be a thermistor.

The step of changing the selectable impedance value may comprise the step of: switching the selectable impedance value between a first impedance value and a second impedance value so as to bias the impedance of the sensor device, and/or the selectable impedance value may be provided by a network of impedances.

The network of impedances may comprise a first impedance, a second impedance, and a switch; and the method may further comprise the step of: switching the first impedance or the second impedance in-circuit with respect to the bridge circuit.

The method may further comprise the step of: providing another sensor device coupled to the sensor device. The sensor device may behave as series coupled to the another sensor device with respect to the bridge circuit, and the sensor device may behave as parallel coupled to the another sensor device when an RF signal is applied at a node between the sensor device and the another sensor device.

It is thus possible to provide a self-balancing impedance bridge circuit apparatus, and a method therefor, that does not increase the temperature of one or more sensor device in a branch of the bridge circuit above a predetermined temperature associated with inaccurate operation of, or even damage to, the one or more sensor device.

BRIEF DESCRIPTION OF DRAWINGS

At least one embodiment of the invention will now be described, by way of example only, with reference to the accompanying drawings, in which.

DETAILED DESCRIPTION

Figure 1:
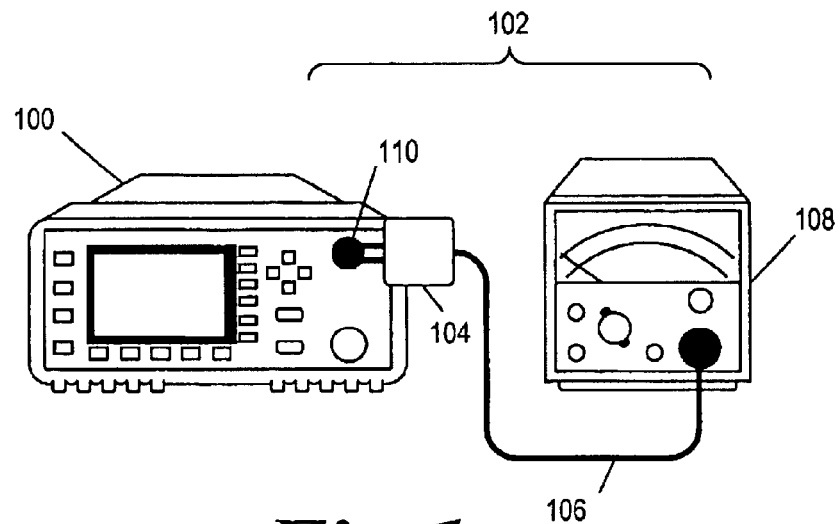
FIG. 1 is a schematic diagram of a power meter coupled to a test power meter system.

Referring to FIG. 1, a power meter 100 is coupled to a test power meter system 102, the test system 102 comprising a sensor unit 104, a cable 106 and a test meter unit 108. The power meter 100 comprises a power reference source (not shown), for example a reference source oscillator, coupled to a reference source port 110. Under test conditions, the reference source port 110 is coupled to the sensor unit 104 in order to achieve coupling of the power meter 100 to the test system 102, the sensor unit 104 being coupled to the test meter unit 108 via the cable 106. In this example, the test meter unit 108 is a 432A meter unit supplied by Agilent Technologies, and the sensor unit 104 is a 478A option H75 or H76 sensor unit supplied by Agilent Technologies. The test meter unit 108 and the sensor unit 104 are suitably adapted in order to conform with the structure described hereinbelow.

Figure 2:
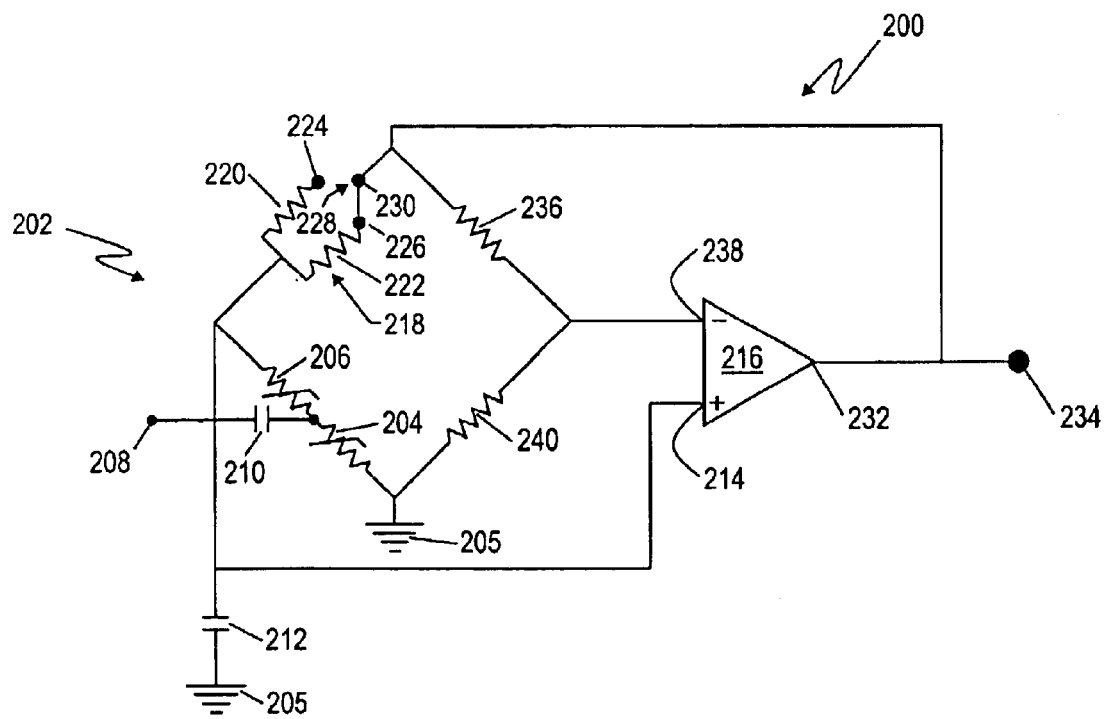
FIG. 2 is a schematic diagram of a self-adjusting impedance bridge apparatus of the system of FIG. 1 and constituting an embodiment of the invention.
Figure 3:
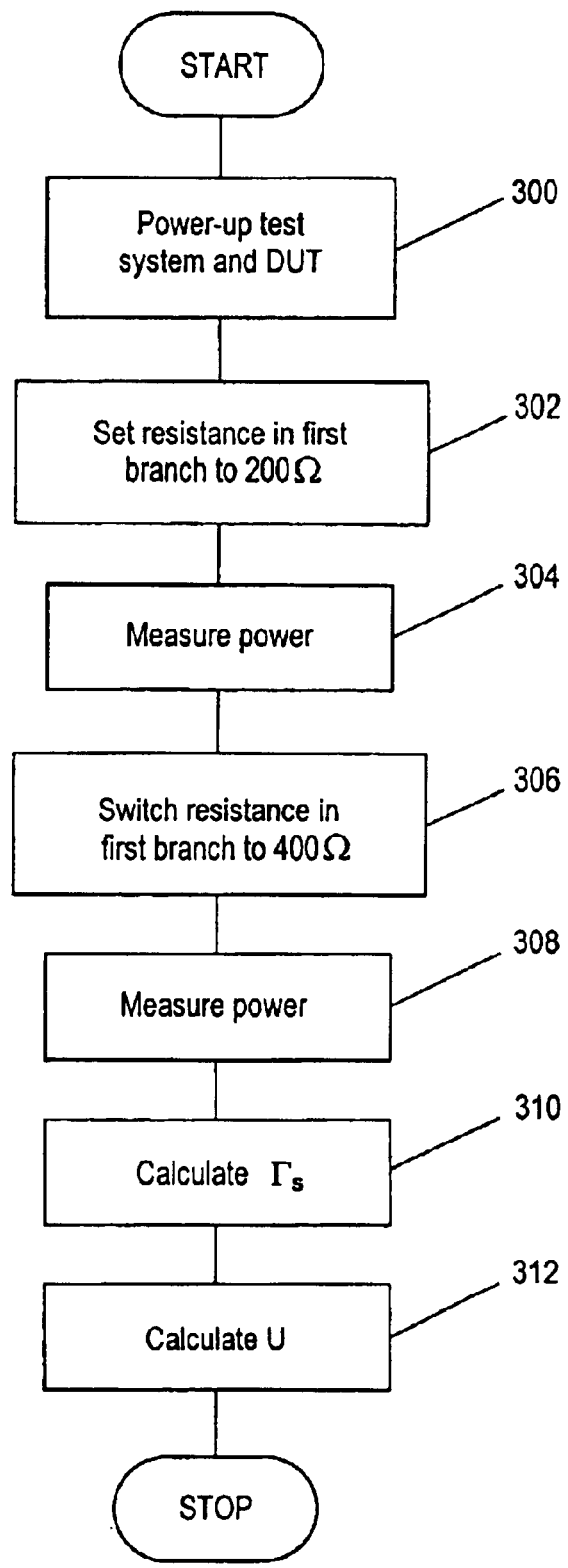
FIG. 3 is a flow diagram of a method for use with the system of FIG. 1 and constituting a second embodiment of the invention.

With regard to FIG. 2, the test system 102 comprises, in part, a self-adjusting impedance bridge 200. The skilled person will appreciate that the test meter unit 108 can, and does in this example, comprise a second "compensation" self-adjusting bridge (not shown). The self-adjusting impedance bridge 200 comprises a bridge circuit 202 having a first thermistor 204 having a first terminal coupled to an earth 205 and a second terminal coupled to a first terminal of a second thermistor 206 and an RF input port 208 via a first capacitor 210; the junction of the first and second thermistors 204, 206 constitute a topological node. A second terminal of the second thermistor 206 is also coupled to the earth 205 via a second capacitor 212, the second terminal of the second thermistor 206 also being coupled to a non-inverting terminal 214 of an operational amplifier 216. The first and second thermistors 204,206 constitute a first branch of the bridge circuit 202. In this example, the thermistors are 33A501/5 thermistors manufactured by Victory Engineering Corporation.

The second terminal of the second thermistor 206 is also coupled to a first terminal of an impedance network 218, the first terminal of the impedance network 218 being coupled to a first terminal of a first resistor 220, for example a 200Ω resistor constituting a first selectable impedance value, and a first terminal of a second resistor 222, for example a 400Ω resistor constituting a second selectable impedance value.

A second terminal of the first resistor 220 and a second terminal of the second resistor 222 are coupled to a first terminal 224 and a second terminal 226, respectively, of a two-way switch 228. A third terminal 230 of the two-way switch 228 is coupled to an output terminal 232 of the operational amplifier 216 and an output terminal 234 of the self-adjusting impedance bridge 200. The first and second resistors 220, 222 and the two-way switch 228 constitute a second branch of the bridge circuit 202. Whilst resistors have been used in this example, other electrical elements capable of providing impedances can be employed in addition to or to replace the first and second resistors 220, 222.

The third terminal 230 of the two-way switch 218 is also coupled to a first terminal of a third resistor 236, for example a 1 kΩ resistor, a second terminal of the third resistor 236 being coupled to an inverting input terminal 238 of the operational amplifier 216. The third resistor 236 constitutes a third branch of the bridge circuit 202.

The second terminal of the third resistor 236 is also coupled to a first terminal of a fourth resistor 240, for example a 1 kΩ resistor, a second terminal of the fourth resistor 240 being coupled to the first terminal of the first thermistor 204 and hence the earth 205.

In order, ultimately, to determine an uncertainty value, U, of the amount of power transferred from the reference source (the source) to the test system 102 (the load), a source VRC and a load VRC need to be calculated. As will be appreciated by a person skilled in the art, the load VRC is known approximately, by virtue of the knowledge of the values of the first and second resistances 220, 222 forming the impedance network 218, and the values of the third resistor 236 and fourth resistor 240. Alternatively, the load VRC can be measured by a conventional technique, for example, by using a VNA.

Therefore, it is necessary to carry out measurements in order to calculate the source VRC, $\Gamma_S$. The ability to vary the impedance value switched into the bridge circuit 202 at the second branch, results in an ability to vary the impedance of the first and second thermistors 204, 206, thereby causing the load VRC, $\Gamma_L$, to be varied as well. Hence, two different conditions under which power is delivered to the test power meter 108, or load, are provided.

It should be understood that the second compensation self-adjusting bridge (not shown) also comprises a corresponding secondary bridge circuit (not shown). The structure of the secondary bridge circuit is the same as the bridge circuit 202.

In order to understand how the above two conditions under which power can be delivered to the test power meter system 102 can be used to calculate the source VRC, $\Gamma_S$, and hence the mismatch uncertainty value, U, a mathematical basis for calculation of the source VRC, $\Gamma_S$, is set out below.

Based upon equation (1) above, if the load VRC can assume two different values, $\Gamma_1$ and $\Gamma_2$, and the two different values give rise to two different respective power measurements, $P_1$ and $P_2$ (the available powers remaining the same), the equation (1) can be expressed as:

$$P_{Z_0} = P_1 \frac{|1 - \Gamma_S \Gamma_1|^2}{1 - |\Gamma_1|^2} = P_2 \frac{|1 - \Gamma_S \Gamma_2|^2}{1 - |\Gamma_2|^2} \qquad (3)$$

Rearranging equation (3):

$$\frac{P_1}{P_2} \frac{(1 - |\Gamma_2|^2)}{(1 - |\Gamma_1|^2)} = \frac{|1 - \Gamma_S \Gamma_2|^2}{|1 - \Gamma_S \Gamma_1|^2} \qquad (4)$$

Given that $P_1$, $P_2$, $\Gamma_1$, $\Gamma_2$ can either be calculated or measured, the left side of equation (4) can be replaced by a factor, M, giving:

$$\sqrt{M} = \frac{|1 - \Gamma_S \Gamma_2|}{|1 - \Gamma_S \Gamma_1|} \qquad (5)$$

Whilst equation (5) can not be directly solved for the source VRC, $\Gamma_S$, because the source VRC, $\Gamma_S$, is a complex quantity, an approximate solution using the two values of the load VRC, $\Gamma_L$, is:

$$|\Gamma_S| = \frac{(2|\Gamma_1|M - 2|\Gamma_2|) \pm \sqrt{(2|\Gamma_2| - 2|\Gamma_1|M)^2 - 4(|\Gamma_1|^2 M - |\Gamma_2|^2)(M-1)}}{2(|\Gamma_1|^2 M - |\Gamma_2|^2)} \quad (6)$$

Using equation (6) above, an adequately accurate result for the source VRC, $\Gamma_S$, can be obtained provided a phase angle $\theta$ of the reference source is within one of the ranges $-40° \leq \theta \leq 40°$, $140° \leq \theta \leq 180°$, or $-180° \leq \theta \leq -140°$. Consequently, in order to be able to calculate the source VRC, $\Gamma_S$, the following measurement steps are carried out.

In operation, the sensor unit 104 is coupled to the reference source port 110 and the power meter 100 and the test system 102 are powered-up (step 300). The switch 230 of the test meter unit 108 is then set to, or a user verifies that the switch 230 is already set to, the first impedance value (step 302), in this example 200Ω. The reading of the test meter unit 108 is then recorded (step 304) by the user. The switch 230 is then set by the user to the second impedance value (step 306), in this example 400Ω, and the reading of the test meter unit 108 is again recorded (step 308) by the user. A corresponding switch (not shown) of the second compensation bridge circuit (not shown) is actuated at substantially the same time as the switch 230 is actuated.

The impedance network 218 and the first and second thermistors 204, 206 are part of the self-adjusting impedance bridge 200, and so the effective replacement of the first resistor 220 with the second resistor 222 in the second branch of the bridge circuit 202 by means of actuating the two-way switch 230 biases an impedance value provided by the first and second thermistor combination 204, 206. Whilst, at DC, the first and second thermistors 204, 206 behave as series coupled, at RF, the first and second thermistors 204, 206 behave as parallel coupled, and so the impedance value is biased from approximately 50Ω at RF to 100Ω at RF.

Given that the first and second thermistors 204, 206 have, in this example, negative temperature coefficients, the increase in impedance of the first and second thermistors 204, 206 does not result in a consequential rise in temperature of the first and second thermistors 204, 206, which would have occurred had the second resistor 222 been rated at a value less than the first resistor 220. Consequently, undesirable heating of the first and/or second thermistor 204, 206, beyond a predetermined temperature corresponding to damage or inaccurate operation of the first and/or second thermistor 204, 206, is avoided.

Once the source and load VRCs, $\Gamma_L$ and $\Gamma_S$, are known, the uncertainty value, U, is calculated (step 312) from the equation (2).

Whilst the above examples have been described in the context of one or more thermistors, it should be appreciated that other sensor devices, such as other types of bolometric devices, can be employed in place of, or in combination with, the one or more thermistor, where heating of the sensor device above, or even below, a predetermined temperature threshold is to be avoided, depending upon the temperature coefficient(s) of the sensor device(s). Additionally, the skilled person will understand that references, implicit or explicit, herein to DC operation of the self-adjusting impedance bridge (and the second compensation self-adjusting impedance bridge) do not preclude operation of these bridges with higher frequency signals than DC, for example, 10 KHz audio signals. In such cases, references to resistances should be read as references to impedances.

What is claimed is:

1. A self-balancing impedance bridge circuit apparatus for measuring RF power, the apparatus comprising:
   a bridge circuit comprising a first branch connected to a second branch thereof; wherein
   the first branch comprises a sensor device having an impedance value and a temperature coefficient associated therewith, a temperature of the sensor device being related to the impedance value;
   the second branch comprises at least one electrical element capable of providing a selectable impedance value, the selectable impedance value biasing, when in use, the impedance value of the sensor device; and
   the selectable impedance value is such that the impedance value of the sensor device corresponds to the temperature of the sensor device not exceeding a predetermined temperature.

2. An apparatus as claimed in claim 1, wherein the temperature coefficient is a negative temperature coefficient.

3. An apparatus as claimed in claim 1, wherein the sensor device is a bolometric device.

4. An apparatus as claimed in claim 3, wherein the bolometric device is a thermistor.

5. An apparatus as claimed in claim 1, wherein the at least one electrical element capable of providing the selectable impedance value is switchable.

6. An apparatus as claimed in claim 5, wherein the at least one electrical element capable of providing the selectable impedance value is a network of impedances.

7. An apparatus as claimed in claim 6, wherein the network of impedances comprises a first impedance, a second impedance, and a switch for connecting the first impedance or the second impedance in-circuit with respect to the bridge circuit.

8. An apparatus as claimed in claim 1, further comprising another sensor device coupled to the sensor device.

9. An apparatus as claimed in claim 8, wherein the sensor device behaves as series coupled to the another sensor device with respect to the bridge circuit, and the sensor device behaves as parallel coupled to the another sensor device, when an RF signal is applied at a node between the sensor device and the another sensor device.

10. An apparatus as claimed in claim 1, wherein the bridge circuit further comprises:
    a third branch coupled to a fourth branch, the third and fourth branches including a substantially same impedance; and
    the third branch is coupled to the second branch and the fourth branch is coupled to the first branch.

11. A method of measuring RF power for a self-adjusting impedance bridge, the method comprising the steps of:
    setting a selectable impedance value of a first branch of a bridge circuit so as to bias an impedance of a sensor device in a second branch of the bridge circuit coupled to the first branch of the bridge circuit, a temperature of the sensor device relating to the impedance of the sensor device; wherein
    the sensor device has a temperature coefficient associated therewith; and
    the selectable impedance value is such that the impedance of the sensor device corresponds to the temperature of the sensor device not exceeding a predetermined temperature.

12. A method as claimed in claim 11, wherein the temperature coefficient is a negative temperature coefficient.

13. A method as claimed in claim 11, wherein the sensor device is a bolometric device.

14. A method as claimed in claim 13, wherein the bolometric device is a thermistor.

15. A method as claimed in claim 11, wherein the step of changing the selectable impedance value comprises the step of:

switching the selectable impedance value between a first impedance value and a second impedance value so as to bias the impedance of the sensor device.

16. A method as claimed in claim 15, wherein the selectable impedance value is provided by a network of impedances.

17. A method as claimed in claim 16, wherein the network of impedances comprises a first impedance, a second impedance, and a switch; and the method further comprises the step of:

switching the first impedance or the second impedance in-circuit with respect to the bridge circuit.

18. A method as claimed in claim 11, further comprising the step of:

providing another sensor device coupled to the sensor device.

19. An method as claimed in claim 18, wherein the sensor device behaves as series coupled to the another sensor device with respect to the bridge circuit, and the sensor device behaves as parallel coupled to the another sensor device when an RF signal is applied at a node between the sensor device and the another sensor device.

* * * * *